(12) United States Patent
Ishii

(10) Patent No.: US 8,247,818 B2
(45) Date of Patent: Aug. 21, 2012

(54) ELECTRO-OPTICAL DEVICE AND ELECTRONIC APPARATUS

(75) Inventor: Tatsuya Ishii, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 21 days.

(21) Appl. No.: 13/079,277

(22) Filed: Apr. 4, 2011

(65) Prior Publication Data

US 2011/0241004 A1    Oct. 6, 2011

(30) Foreign Application Priority Data

Apr. 5, 2010   (JP) ................................. 2010-086765

(51) Int. Cl.
*H01L 33/00* (2010.01)

(52) U.S. Cl. .......................................... 257/59; 257/72
(58) Field of Classification Search ............... 257/59–72, 257/E33.053, E33.004, E33.014
See application file for complete search history.

(56) References Cited

U.S. PATENT DOCUMENTS

| | | | |
|---|---|---|---|
| 6,057,897 A | 5/2000 | Ichikawa et al. | |
| 6,953,949 B2 * | 10/2005 | Murade | 257/59 |
| 7,994,505 B2 * | 8/2011 | Saitou et al. | 257/59 |
| 2009/0152551 A1 * | 6/2009 | Yamazaki | 257/59 |
| 2011/0227097 A1 * | 9/2011 | Tsubata et al. | 257/88 |

FOREIGN PATENT DOCUMENTS

JP    10-177190 A    6/1998

* cited by examiner

*Primary Examiner* — Cuong Q Nguyen
(74) *Attorney, Agent, or Firm* — AdvantEdge Law Group, LLC

(57) ABSTRACT

A semiconductor layer of a TFT is continuously formed from an inside of an open hole portion overlapping with an intersection up to an outside of the open hole portion and includes a first source/drain area electrically connected to a surface portion of the data line exposed to a bottom surface of the open hole portion, a channel area disposed on a side wall of the open hole portion, and a second source/drain area formed outside the open hole portion and electrically connected to the pixel electrode. The gate electrode of the TFT is formed inside the open hole portion so as to overlap with at least the channel area and is electrically connected to a scanning line.

5 Claims, 8 Drawing Sheets

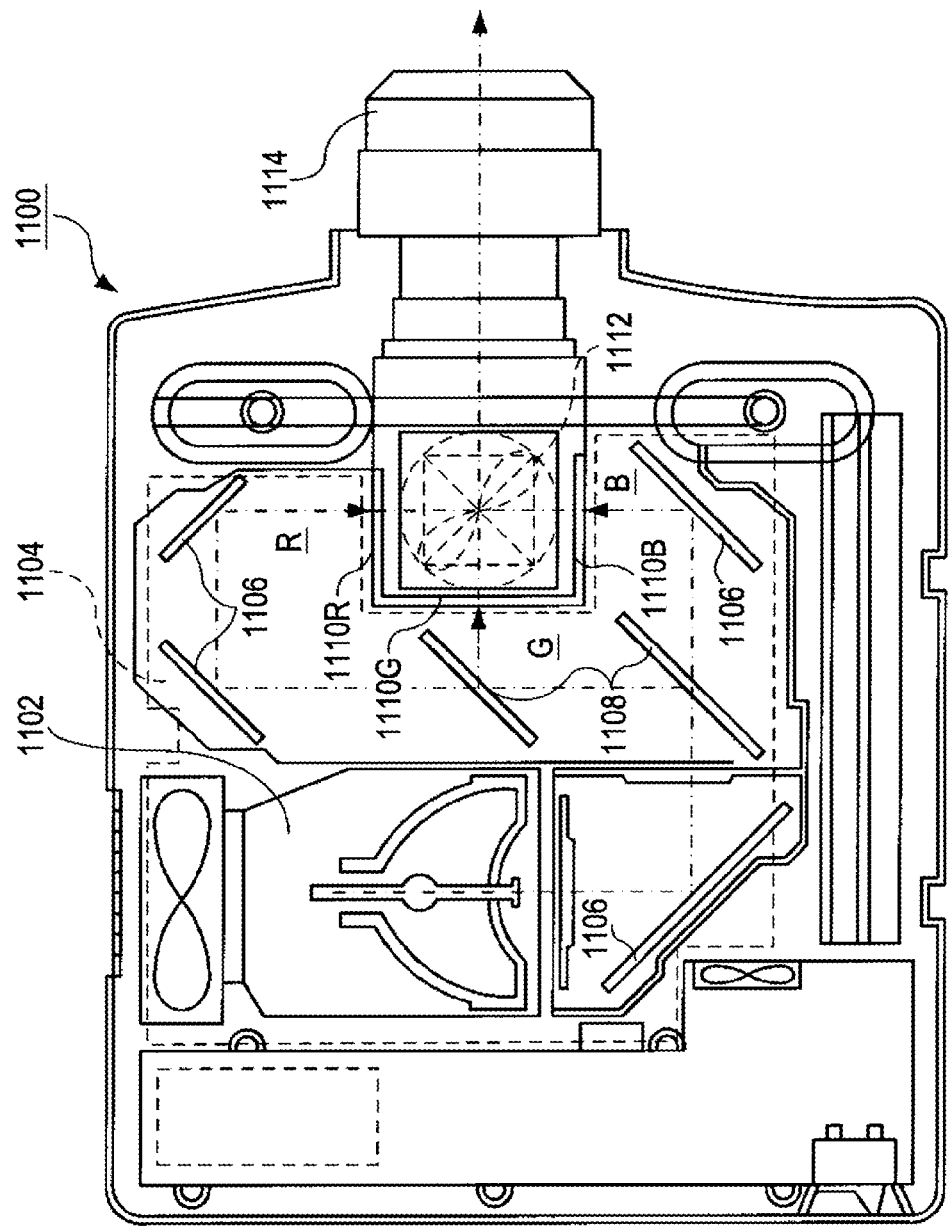

ELECTRO-OPTICAL DEVICE AND ELECTRONIC APPARATUS

BACKGROUND

1. Technical Field

The present invention relates to an electro-optical device such as a liquid crystal device and an electronic apparatus including the electro-optical device.

2. Related Art

As an electro-optical device, JP-A-10-177190 discloses the layout configuration of the pixels in which a pixel switching transistor (TFT: Thin Film Transistor) is formed in a planar manner along a substrate surface. Specifically, the source area of the transistor is commonly used between the adjacent pixels and electric connection to data lines is made via common contacts in order to reduce a pixel pitch and achieve high accuracy (for example, see FIG. 3 or 4 in JP-A-10-177190). In this configuration, since channel areas and source and drain areas of the transistors are disposed in a plane direction along a substrate surface, current also flows in the plane direction.

In the above-described layout configuration, however, a technical problem may arise in that it is difficult to ensure a high aperture ratio while realizing the narrow pitch and the high accuracy of the pixel since the area where the transistor is formed in a planar manner has to be guaranteed. Moreover, a technical problem may arise in that the light-shielding property of the transistor deteriorates.

SUMMARY

An advantage of some aspects of the invention is that it provides an electro-optical device capable of realizing a high aperture ratio as well as a narrow pitch and a high accuracy of a pixel and an electronic apparatus including the electro-optical device.

According to an aspect of the invention, there is provided an electro-optical device including: data lines; scanning lines; pixel electrodes disposed so as to correspond to intersections of the data lines and the scanning lines, respectively; transistors including a gate electrode and a semiconductor layer and switching-controlling signal supply to the pixel electrodes; and an insulating film disposed between the data lines and the scanning lines. The insulation film has an open hole portion holed so as to overlap with each of the intersections of the data lines and the scanning lines. The semiconductor layer is continuously formed from an inside of the open hole portion up to an outside of the open hole portion and includes a first source/drain area electrically connected to a surface portion of the data line exposed to a bottom surface of the open hole portion, a channel area disposed on a side wall of the open hole portion, and a second source/drain area formed outside the open hole portion and electrically connected to the pixel electrode. The gate electrode is formed inside the open hole portion so as to overlap with at least the channel area and is electrically connected to the scanning line.

In the electro-optical device according to the aspect of the invention, when at least one of the data line and the scanning line in the display area on the substrate is formed of a conductive material having a light-shielding property, it is possible to shield light incident on the intersection. The open hole portion is disposed in the insulation film insulating the layer of the data line and the layer of the scanning line from each other so as to overlap with the intersection. The open hole portion is holed through the insulation film so that the surface portion of the data line is exposed to the bottom surface.

The semiconductor layer and the gate electrode of the pixel switching transistor are formed in the open hole portion as follows. The semiconductor layer is continuously formed from the inside of the open hole portion up to the outside of the open hole portion. When the transistor is manufactured, for example, the channel area, the first source/drain area, and the second source/drain area are formed by implanting high-concentration impurities toward the semiconductor layer in a vertical direction (that is, a longitudinal direction) substantially perpendicular to a plane direction oriented along the substrate surface. Thus, in the semiconductor layer, the first source/drain area is disposed on the bottom surface of the open hole portion and is electrically connected to the surface portion of the data line, the second source/drain area is disposed outside the open hole portion and is electrically connected to the pixel electrode, and the channel area is disposed on the side wall of the open hole portion. On the other hand, the gate electrode is formed along the side wall of the open hole portion so as to overlap with at least the channel area and is electrically connected to the scanning line.

Accordingly, the first source/drain area, the channel area, and the second source/drain area are disposed at the intersection of the data line and the scanning line in the longitudinal direction (that is, the vertical direction), so that a longitudinal transistor in which current can flow in the longitudinal direction is formed. Therefore, the disposition area of the transistor with respect to the pixel on the substrate can be easily narrowed, compared to a configuration in which a transistor is formed in a planar manner, as described above. Thus, a high aperture ratio can be ensured by realizing the narrow pitch and the high accuracy of the pixel more easily. Moreover, as well as this advantage, it is possible to more reliably improve the light-shielding property by disposing the longitudinal transistor at the intersection of the data line and the scanning line.

Thus, the electro-optical device according to the aspect of the invention can perform higher quality display.

In the electro-optical device according to the aspect of the invention, a convex portion may be formed in the insulation film so as to overlap with the intersection and the open hole portion is disposed in the convex portion. The gate electrode may be formed from the inside of the open hole portion up to the outside of the open hole portion so as to cover the convex portion.

With such a configuration, the open hole portion is formed in the convex portion in the insulation film and the gate electrode is formed up to the outside of the open hole portion so as to cover the convex portion. Therefore, light incident on the semiconductor layer can be more reliably shielded even in the outside of the open hole portion by the gate electrode. Accordingly, it is possible to further improve the light-shielding property of the transistor.

According to another aspect of the invention, there is provided an electronic apparatus including the electro-optical device (including various kinds of forms). Therefore, it is possible to realize various types of electronic apparatuses such as a projection type display apparatus, a television, a mobile phone, an electronic pocket book, a word processor, a view finder type or monitor direct vision-type video tape recorder, a work station, a television phone, a POS terminal, and an apparatus with a touch panel, capable of performing high quality display. In addition, the electronic apparatus according to the aspect of the invention includes an electrophoretic display such as an electronic paper, a field emission display and conduction electron-emitter display, and a display apparatus using the electrophoretic display and the field emission display and conduction electron-emitter display.

The operation and other advantages of the invention are apparent from the embodiments described below.

BRIEF DESCRIPTION OF THE DRAWINGS

The invention will be described with reference to the accompanying drawings, wherein like numbers reference like elements.

FIG. 12 is a plan view illustrating the configuration of a projector which is an example of an electronic apparatus including the electro-optical device.

DESCRIPTION OF EXEMPLARY EMBODIMENTS

Hereinafter, embodiments of the invention will be described with reference to the drawings.
Electro-Optical Device An electro-optical device according to the embodiments will be described with reference to FIGS. 1 to 11. A TFT active matrix driving type liquid crystal device having a driving circuit therein will be described as an example of the electro-optical device according to the embodiments of the invention.

First Embodiment

Figure 1:
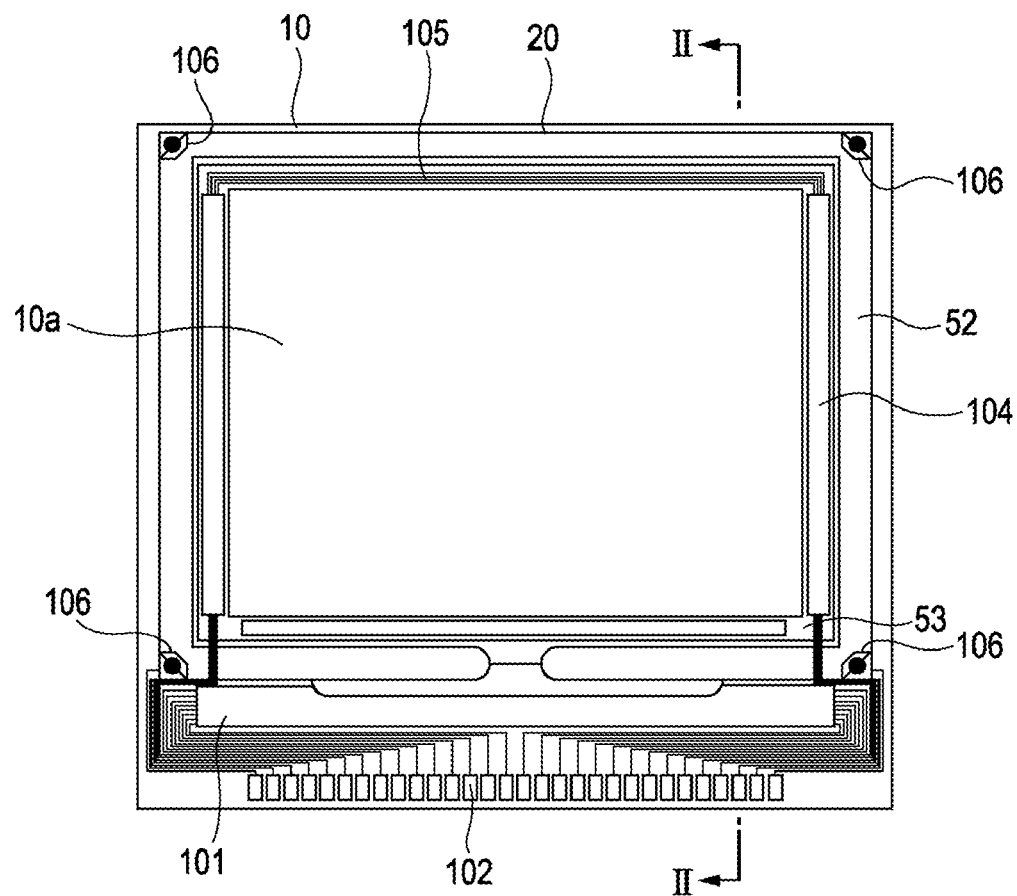
FIG. 1 is a plan view illustrating the entire configuration of an electro-optical device according to a first embodiment.
Figure 2:
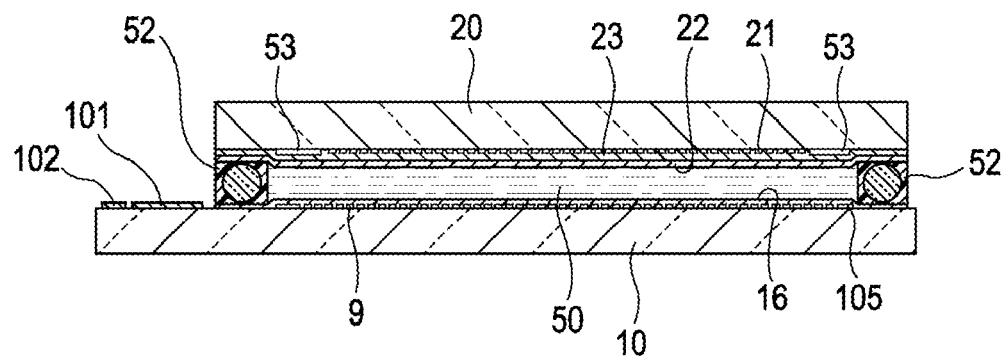
FIG. 2 is a sectional view taken along the line II-II of FIG. 1.

First, the entire configuration of the electro-optical device according to a first embodiment will be described with reference to FIGS. 1 and 2. FIG. 1 is a plan view illustrating the entire configuration of the electro-optical device according to this embodiment. FIG. 2 is a sectional view taken along the line II-II of FIG. 1.

In the electro-optical device according to this embodiment, as shown in FIGS. 1 and 2, a TFT array substrate 10 and a counter substrate 20 are disposed opposite to each other. The TFT array substrate 10 is an example of a "substrate" of the invention and is a transparent substrate such as a quartz substrate or a glass substrate, a silicon substrate, or the like. The counter substrate 20 is a transparent substrate such as a quartz substrate or a glass substrate. A liquid crystal layer 50 is enclosed between the TFT array substrate 10 and the counter substrate 20. The liquid crystal layer 50 includes liquid crystal in which one kind or various kinds of nematic liquid crystal are mixed and which takes a predetermined alignment state between a pair of alignment films.

The TFT array substrate 10 and the counter substrate 20 are attached to each other by a sealing member 52 disposed in a sealing area formed in the periphery of an image display area 10a where a plurality of pixel electrodes is disposed. The image display area 10a is an example of a "display area" according to the invention.

The sealing member 52 is used to attach the both substrates to each other and is formed of, for example, an ultraviolet curing resin or a thermosetting resin. The sealing member 52 is applied onto the TFT array substrate 10 in a manufacturing process, and then is cured by ultraviolet emission, heating, or the like. In the sealing member 52, a gap material such as fiberglass or glass beads is dispersed to maintain the gap (that is, inter-substrate gap) at a predetermined value between the TFT array substrate 10 and the counter substrate 20. In addition to or Instead of dispersion of the gap material in the sealing member 52, the gap material may be disposed in the image display area 10a or the peripheral area located in the periphery of the image display area 10a.

A frame light-shielding film 53 defining a frame area of the image display area 10a and having a light-shielding property is disposed in parallel inside the sealing area of the sealing member 52 and on the side of the counter substrate 20. A part or the entirety of the frame light-shielding film 53 may be disposed as an internal light-shielding film of the TFT array substrate 10.

In the peripheral area, a data line driving circuit 101 and external circuit connection terminals 102 are disposed along one side of the TFT array substrate 10 in the area outside the sealing area of the sealing material 52. Scanning line driving circuits 104 are disposed along two sides adjacent to the one side of the TFT array substrate 10 so as to be covered with the frame light-shielding film 53. In order to connect the two scanning line driving circuits 104 disposed on both sides of the image display area 10a to each other, a plurality of wirings 105 is disposed along the one remaining side of the TFT array substrate 10 so as to be covered with the frame light-shielding film 53.

Vertical conductive terminals 106 vertically connecting the both substrates through conductive materials are disposed in the areas of the TFT array substrate 10 facing the four corner portions of the counter substrate 20. Thus, electric conductivity is realized between the TFT array substrate 10 and the counter substrate 20.

In FIG. 2, a laminate structure, in which the pixel switching TFTs (Thin Film Transistors), which is a driving element, and wirings such as the scanning lines and the data lines are formed, is formed on the TFT array substrate 10. The detailed laminate structure is not illustrated in FIG. 2, but the pixel electrode 9 made of a transparent material such as ITO (Indium Tin Oxide) is formed on the laminate structure in an island shape in a predetermined pattern in each pixel.

The pixel electrodes 9 are formed in the image display area 10a on the TFT array substrate 10 so as to face the counter electrodes 21. An alignment film 16 is formed on the surface, that is, the pixel electrode 9 of the TFT array substrate 10 facing the liquid crystal layer 50 so as to cover the pixel electrodes 9.

A light-shielding film 23 is formed on the surface of the counter substrate 20 facing the TFT array substrate 10. The light-shielding film 23 is formed in a lattice shape in a plan view on the surface of the counter substrate 20 facing the TFT array substrate 10. A non-open area is defined by the light-shielding film 23 in the counter substrate 20 and the area partitioned by the light-shielding film 23 serves as an open area through which light emitted from, for example, a projector lamp or a direct view backlight passes. The light-shielding film 23 may be formed in a stripe shape and the non-open area may be defined by the light-shielding film 23 and various constituent elements such as the data lines disposed on the side of the TFT array substrate 10.

The counter electrode 21 formed of a transparent terminal such as ITO is formed on the light-shielding film 23 so as to face the plurality of pixel electrodes 9. On the light-shielding film 23, a color filter, which is not shown in FIG. 2, may be formed in an area including parts of the open area and the non-open area in order to display colors in the image display area 10a. On the facing surface of the counter substrate 20, an alignment film 22 is formed on the counter electrode 21.

For example, a sampling circuit sampling the image signals of image signal lines and supplying the sampled signals to the data lines, a precharge circuit supplying a precharge signal with a predetermined voltage level to the plurality of data lines before the image signal, and an inspection circuit inspecting the quality, defect, or the like of the electro-optical device during a manufacturing process or a shipment may be formed on the TFT array substrate 10 shown in FIGS. 1 and 2, as well as the driving circuits such as the data line driving circuit 101 and the scanning line driving circuits 104 described above.

Figure 3:
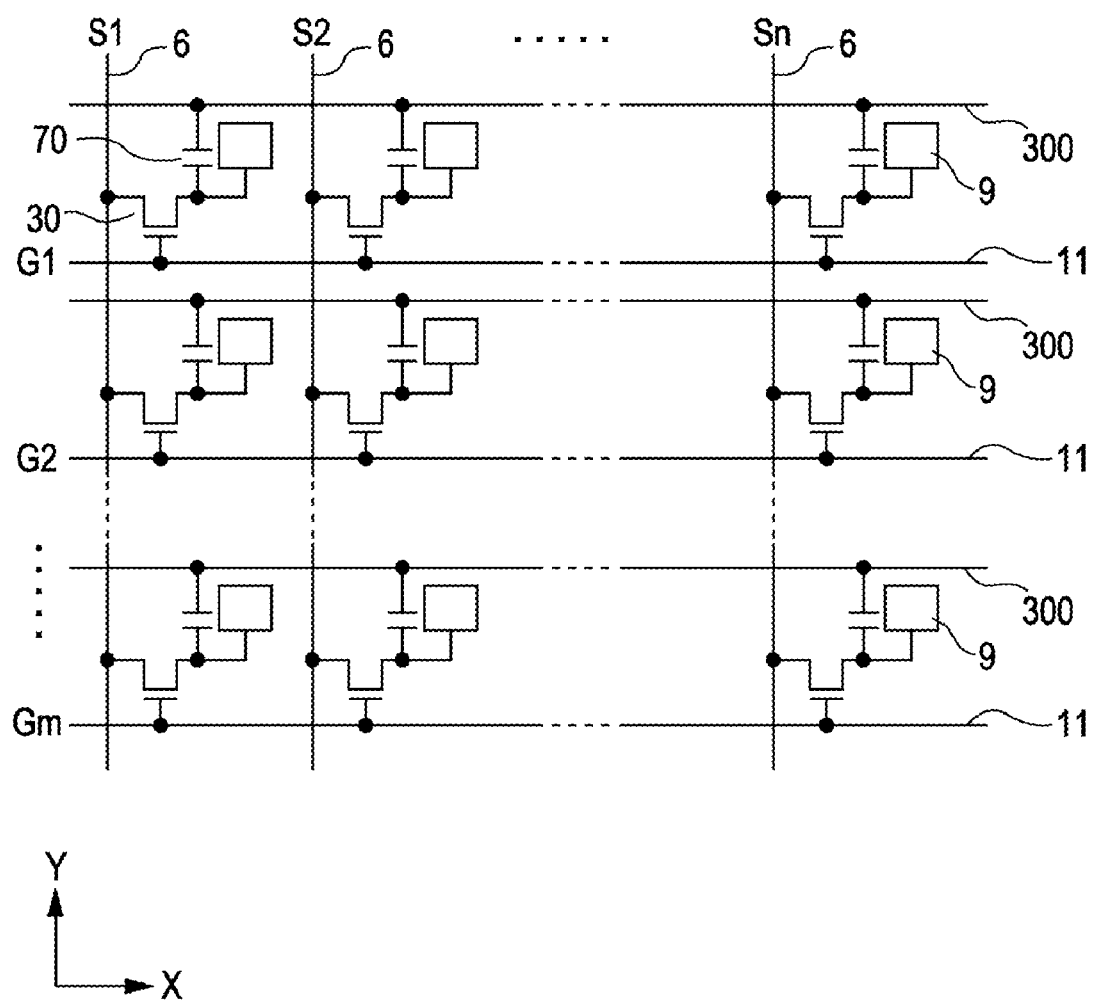
FIG. 3 is an equivalent circuit diagram illustrating various elements, wirings, and the like of a plurality of pixels forming an image display area of the electro-optical device according to the first embodiment.

Next, the electric configuration of a pixel unit of the electro-optical device according to this embodiment will be described with reference to FIG. 3. FIG. 3 is an equivalent circuit diagram illustrating various elements, wirings, and the like of the plurality of pixels which is formed in a matrix form and forms an image display area of the electro-optical device according to this embodiment.

In FIG. 3, the pixel electrode 9 and the TFT 30 are formed in each of the plurality of pixels which is formed in the matrix form and form the image display area 10a. The TFT 30 is an example of a "pixel switching transistor" according to the invention. The TFT 30 is electrically connected to the pixel electrode 9 and controls switching of the pixel electrode 9 when the electro-optical device according to this embodiment operates. The data lines 6 to which image signals are supplied are electrically connected to the sources of the TFT 30. The image signals S1, S2, . . . , and Sn written to the data lines 6 may be supplied sequentially in this order or may be supplied to each group of the plurality of data lines 6 adjacent to each other.

The scanning lines 11 are electrically connected to the gates of the TFTs 30, and pulse scanning signals G1, G2, . . . , and Gm are applied sequentially in this order to the scanning lines 11 at predetermined timings in the electro-optical device according to this embodiment. The pixel electrodes 9 are electrically connected to the drains of the TFTs 30, and the image signals S1, S2, . . . , and Sn supplied from the data lines 6 are written at predetermined timings by closing the switches of the TFTs 30, which are switching elements, only during a predetermined period. The image signals S1, S2, . . . , and Sn with a predetermined level written to the liquid crystal, which is an example of an electro-optical material, via the pixel electrodes 9 are held between the pixel electrodes and the counter electrode formed in the counter electrode during a predetermined period.

The liquid crystal of the liquid crystal layer 50 (see FIG. 2) has a function of modulating light and displaying gray scales by varying alignment or order of a molecule set by the applied voltage level. For example, in a normally white mode, a transmittance for incident light decreases according to a voltage applied in a unit of each pixel. In a normally black mode, a transmittance for incident light increases according to a voltage applied in a unit of each pixel. Therefore, as a whole, light with the contrast according to the image signals is emitted from the electro-optical device.

In order to prevent leakage of the held image signals, storage capacitors 70 are added in parallel with liquid crystal capacitors formed between the pixel electrodes 9 and the counter electrode 21 (see FIG. 2). The storage capacitor 70 is a capacitor element functioning as a holding capacitor temporarily holding the potential of the pixel electrode 9 according the supply of the image signal. The detailed configuration of the storage capacitor 70 will be described below.

Figure 4:
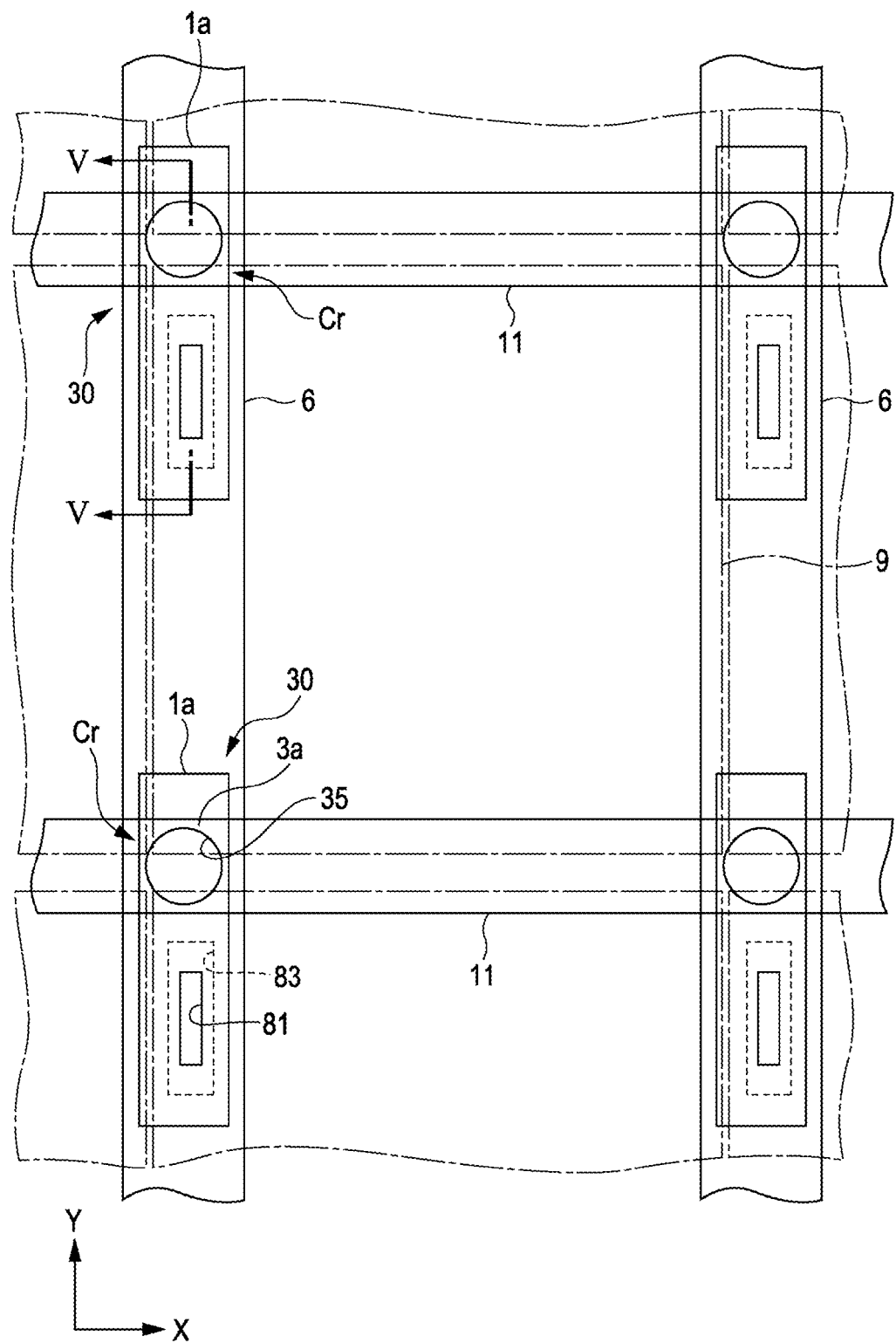
FIG. 4 is a plan view illustrating a plurality of pixel units adjacent to each other.
Figure 5:
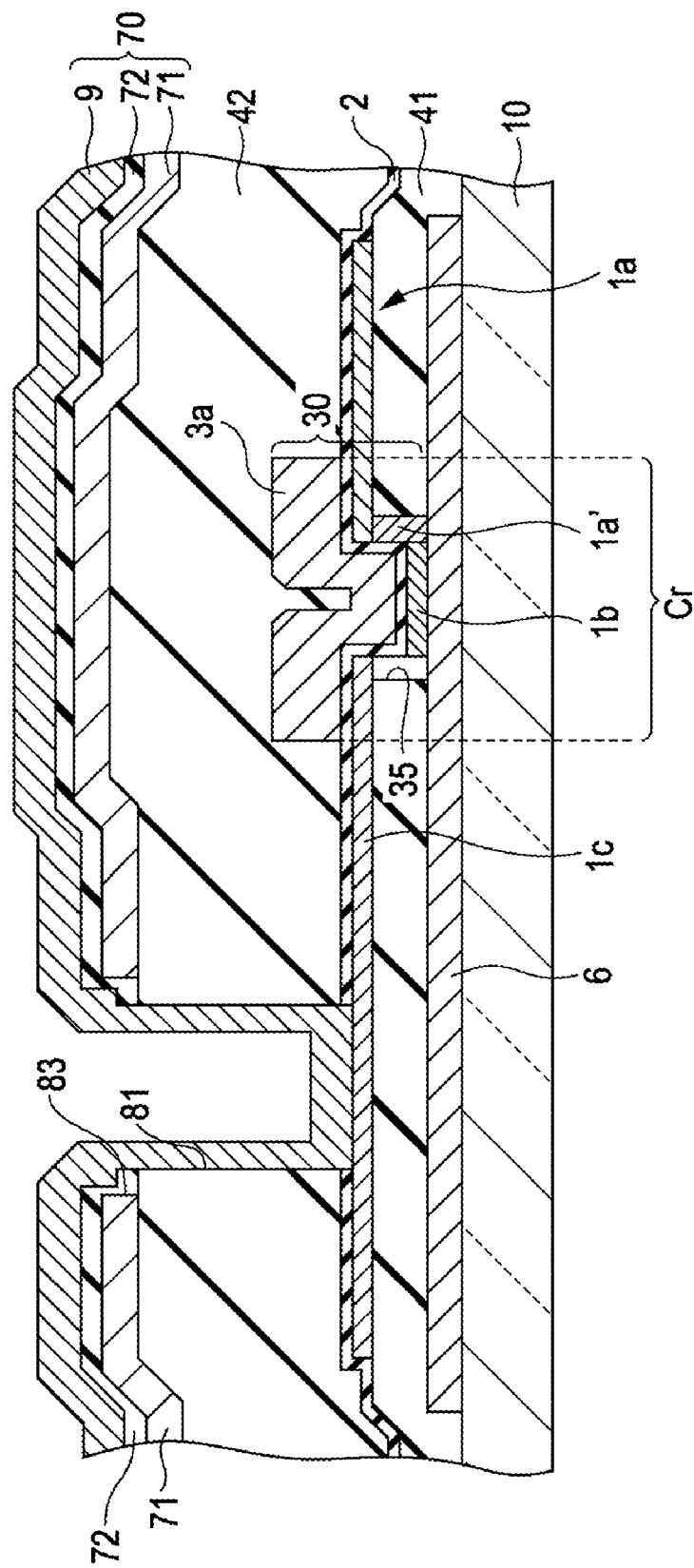
FIG. 5 is a sectional view taken along the line V-V of FIG. 4.

Next, the detailed configuration of the pixel unit realizing the above-described operation will be described with reference to FIGS. 4 and 5. FIG. 4 is a plan view illustrating the plurality of pixel units adjacent to each other. FIG. 5 is a sectional view taken along the line V-V of FIG. 4. In order to enlarge each layer and each member so as to be recognizable in the drawing, each layer and each member are appropriately shown with different scales in FIGS. 4 and 5. In FIGS. 4 and 5, the portions located above the pixel electrodes 9 are not illustrated in order to facilitate easy description.

In FIG. 4, the scanning lines 11 and the data lines 6 are disposed in an X direction and a Y direction on the TFT array substrate 10 respectively. The pixel switching TFT 30 is disposed at each of the intersections at which the scanning lines 11 and the data lines 6 intersect with each other. The pixel electrodes 9 are disposed in the matrix form so as to cover the open areas excluding the non-open areas defined by the scanning lines 11, the data lines 6, and the like.

In FIGS. 4 and 5, the TFT 30 includes a semiconductor layer 1a and a gate electrode 3a facing each other.

The semiconductor layer 1a is formed of, for example, poly-silicon. As shown in FIG. 5, the semiconductor layer 1a includes a first source/drain area 1b, a second source/drain area 1c, and a channel area 1a'. The gate electrode 3a is integrally formed with, for example, the scanning line 11 and is electrically connected to the scanning line 11. The gate electrode 3a and the semiconductor layer 1a are insulated by a gate insulation film 2.

In FIG. 5, the data line 6 is disposed below the TFT 30 on the TFT array substrate 10. The layer of the data line 6 and the layers of the scanning line 11 and the gate electrode 3a are insulated by an insulation film 41 formed of, for example, a transparent material. The scanning lines 11 and the data lines 6 are preferably formed of a metal film with a high melting point and have a high-shielding property which shields light. Therefore, at the intersections Cr at which the scanning lines 11 and the data lines 6 intersect with each other, light incident from the side, in which the pixel electrodes 9 and the like are formed, and incident from the opposite side thereof toward the TFT array substrate 10 can be shield.

An open hole portion 35 is formed in the insulation film 41 so as to overlap with the intersection Cr and at least parts of the semiconductor layer 1a and the gate electrode 3a of the TFT 30 are formed inside the open hole portion 35. The data line 6 has a surface portion exposed to the bottom surface of the open hole portion 35 and thus is electrically connected to the first source/drain area 1b. The feature configuration of the TFT 30 will be described below with reference to FIGS. 6 and 7.

In FIG. 5, the storage capacitor 70 is disposed above the TFT 30 on the TFT array substrate 10 with an inter-layer insulation film 42 interposed therebetween and an upper-layer transparent electrode of the storage capacitor 70 is integrally formed with the pixel electrode 9. In the storage capacitor 70, a lower-layer transparent electrode 71 and an upper-layer transparent electrode 9 each formed of a transparent conductive material face each other with a capacitor insulation film 72 interposed therebetween. By providing the storage capacitor 70, it is possible to improve the potential holding characteristic of the pixel electrode 9 and it is possible to improve the display characteristic in which contrast is improved and flicker is reduced. For example, the lower-layer transparent electrode 71 and the capacitor insulation film 72 are formed in the nearly entire image display area 10a on the TFT array substrate 10, and the lower-layer transparent electrode 71 is formed integrally with a capacitor line 300. The capacitor line 300 (see FIG. 3) is electrically connected to, for example, a constant potential source, and thus is maintained with a fixed potential.

As shown in FIGS. 4 and 5, a window portion 83 is holed in the lower-layer transparent electrode 71, a contact hole 81 is perforated through the inter-layer insulation film 42 and the gate insulation film 2 inside the window portion 83, and the upper-layer transparent electrode 9 is continuously formed outward from the contact hole 81 so as to be electrically connected to the surface portion of the second source/drain area 1c of the semiconductor layer 1a.

In FIG. 5, an alignment film (not shown) subjected to predetermined alignment processing such as rubbing processing is disposed on the upper surface of the pixel electrode 9. The above-described configuration of the pixel unit is common to the respective pixel units, as shown in FIG. 4. The pixel units are formed periodically in the image display area 10a (see FIG. 1).

Figure 6:
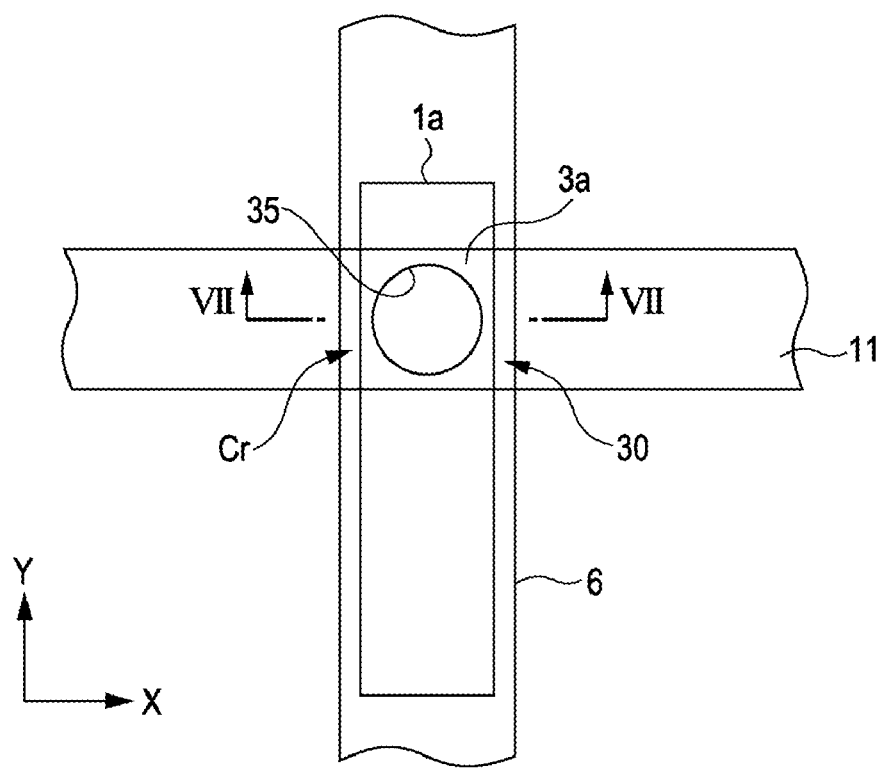
FIG. 6 is a plan view mainly illustrating an arrangement relationship between a TFT and scanning and data lines.
Figure 7:
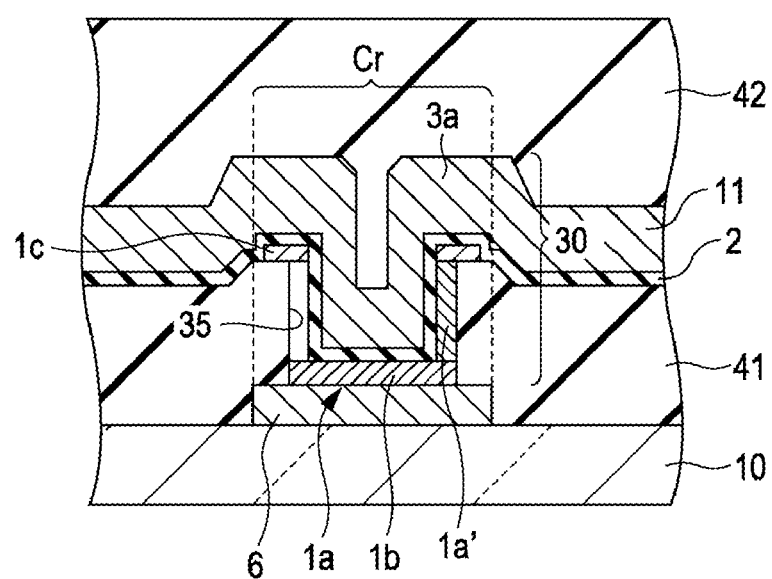
FIG. 7 is a sectional view illustrating the line VII-VII of FIG. 6.

Next, the configuration of the TFT 30 will be described in more detail with reference to FIGS. 6 and 7. FIG. 6 is a plan view mainly illustrating an arrangement relationship between the TFT and the scanning and data lines. FIG. 7 is a sectional view taken along the line VII-VII of FIG. 6. In order to enlarge each layer and each member so as to be recognizable in the drawing, each layer and each member are appropriately shown with different scales in FIGS. 6 and 7. In FIGS. 6 and 7, the feature portions of the laminate structure described with reference to FIG. 4 or 5 are illustrated and other portions are not illustrated in order to facilitate easy description. In FIGS. 6 and 7, the description of the same configuration as that in FIG. 4 or 5 will not sometimes be repeated below.

As shown in FIG. 5, the open hole portion 35 is disposed in the insulation film 41, which insulates the layer of the data line 6 and the layer of the scanning line 11 from each other so as to overlap with the intersection Cr. The open hole portion 35 is holed through the insulation film 41 so that the surface portion of the data line 6 is exposed to the bottom surface, as shown in FIG. 7.

At least the parts of the semiconductor layer 1a and the gate electrode 3a of the TFT 30 are formed inside the open hole portion 35. More specifically, the semiconductor layer 1a is continuously formed from the inside of the open hole portion 35 up to the outside of the open hole portion 35, in FIG. 6 or 7. In the semiconductor layer 1a, as shown in FIG. 7, the first source/drain area 1b is disposed on the bottom surface of the open hole portion 35 and is electrically connected to the surface portion of the data line 6, the second source/drain area 1c is disposed outside the open hole portion 35 and is electrically connected to the pixel electrode 9, as described with reference to FIG. 4 or 5, and the channel area 1a' is disposed on the side wall of the open hole portion 35. On the other hand, the gate electrode 3a is formed along the side wall of the open hole portion 35 so as to overlap with at least the channel area 1a'.

Accordingly, as shown in FIG. 7, the first source/drain area 1b, the channel area 1a', and the second source/drain area 1c are disposed at the intersection Cr of the data line 6 and the scanning line 11 in a longitudinal direction (or a vertical direction) oriented along the lamination direction of the laminate structure of the pixel unit with respect to a plane direction oriented along the substrate surface of the TFT array substrate 10, so that a longitudinal transistor in which current flows in the longitudinal direction is formed. Therefore, the disposition area of the TFT 30 with respect to the pixel on the substrate can be easily narrowed, compared to the configuration in which a transistor is formed in a planar manner, as described above. Thus, a high aperture ratio can be ensured by realizing the narrow pitch and the high accuracy of the pixel more easily. Moreover, as well as this advantage, it is possible to more reliably improve a light-shielding property by disposing the longitudinal transistor at the intersection Cr of the data line 6 and the scanning line 11.

According to the above-described embodiment, it is possible to display an image with higher quality in the electro-optical device.

Figure 8:
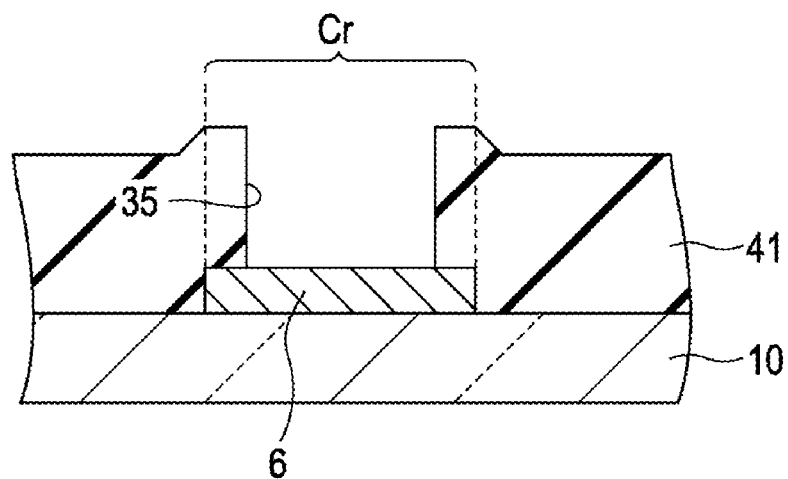
FIG. 8 is a diagram (part 1) illustrating the configuration of a cross-section part shown in FIG. 7 in each step of a process of manufacturing the TFT.
Figure 9:
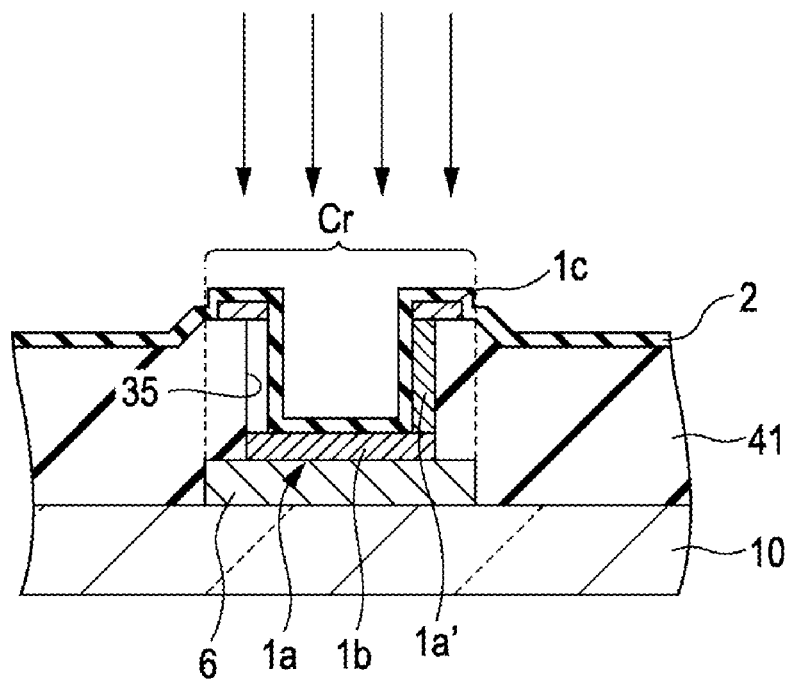
FIG. 9 is a diagram (part 2) illustrating the configuration of the cross-section part shown in FIG. 7 in each step of the process of manufacturing the TFT.

Next, a process of manufacturing the TFT 30 described with reference to FIGS. 6 and 7 will be simply described with reference to FIGS. 8 and 9. FIGS. 8 and 9 are diagrams illustrating the configuration of the cross-section shown in FIG. 7 in respective steps of the process of manufacturing the TFT.

In FIG. 8, each data line 6 is formed on the TFT array substrate 10, and then the insulation film 41 is stacked. Next, each open hole portion 35 is formed in the insulation film 41 so as to overlap with the intersection Cr.

In FIG. 9, the semiconductor layer 1a is continuously formed from the inside of the open hole portion 35 up to the outside of the open hole portion 35, and the gate insulation film 2 is stacked. Thereafter, high-concentration impurities are implanted to the semiconductor layer 1a along a vertical direction indicated by an arrow in FIG. 9. At this time, in the semiconductor layer 1a, the high-concentration impurities are implanted to the portion disposed on the bottom surface of the open hole portion 35 and the portion disposed outside the open hole portion 35 and are not implanted to the portion disposed on the side wall of the open hole portion 35. Thus, the first source/drain area 1b of the semiconductor layer 1a is disposed on the bottom surface of the open hole portion 35, the second source/drain area 1c thereof is disposed outside the open hole portion 35, and the channel area 1a' is disposed on the side wall of the open hole portion 35.

Thereafter, as shown in FIG. 7, the gate electrode 3a is formed to manufacture the TFT 30 as the longitudinal transistor.

Second Embodiment

Figure 10:
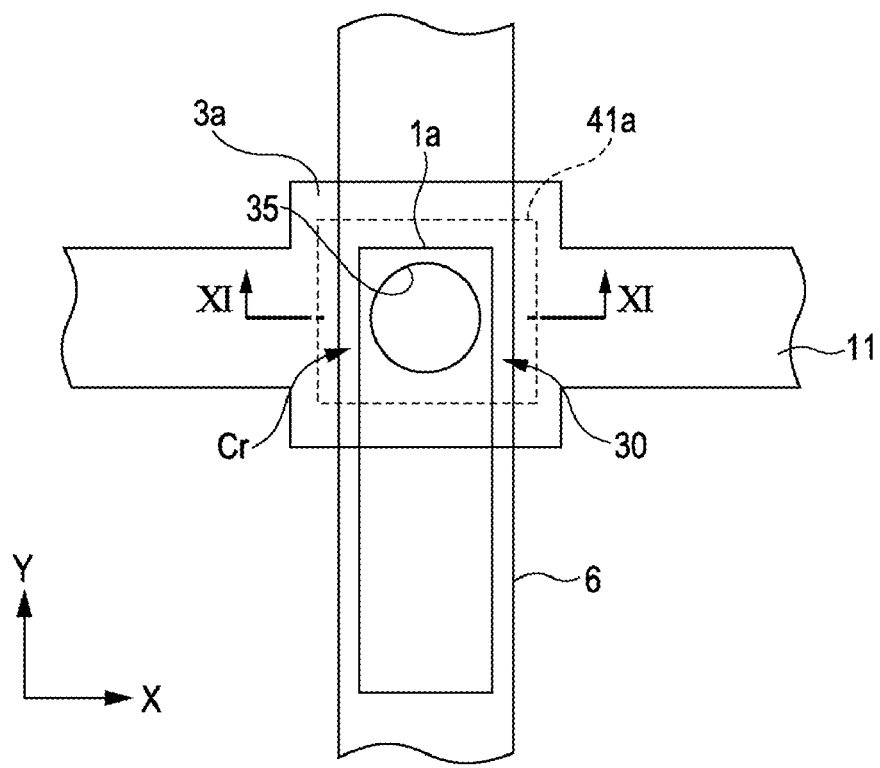
FIG. 10 is a plan view mainly illustrating an arrangement relationship between a TFT and scanning and data lines according to a second embodiment.
Figure 11:
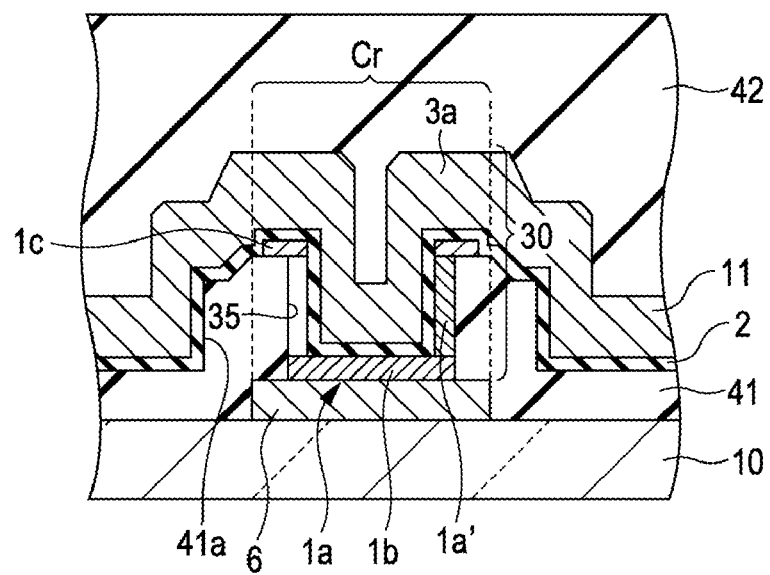
FIG. 11 is a sectional view taken along the line XI-XI of FIG. 10.

Next, the configuration of an electro-optical device according to a second embodiment will be described with reference to FIGS. 10 and 11. In the second embodiment, a part of the configuration of the pixel switching TFT is different from that of the first embodiment. In FIGS. 10 and 11, the same reference numerals are given to the same constituent elements as those of the first embodiment and the description thereof will not be repeated.

Hereinafter, the configuration of the pixel switching TFT 30 will be mainly described in detail according to the second embodiment. FIG. 10 is a plan view mainly illustrating an arrangement relationship between the TFT and the scanning and data lines according to the second embodiment. FIG. 11 is a sectional view taken along the line XI-XI of FIG. 10. In order to enlarge each layer and each member so as to be recognizable in the drawing, each layer and each member are appropriately shown with different scales in FIGS. 10 and 11.

In FIGS. 10 and 11, an island-shaped convex portion 41a is formed in the insulation film 41 so as to overlap with the intersection Cr. The open hole portion 35 is disposed in the convex portion 41a. The gate electrode 3a of the TFT 30 is formed from the inside of the open hole portion 35 up to the outside of the open hole portion 35 so as to cover the convex portion 41a and is formed to cover the outside side wall surface of the convex portion 41a along the side wall of the open hole portion 35. Accordingly, light incident on the channel area 1a' of the semiconductor layer 1a and respective joint portions between the channel area 1a' and the first and second source/drain areas 1b and 1c can be shielded more broadly from the inside of the open hole portion 35 to the outside of the open hole portion 35 by the gate electrode 3a.

Thus, it is possible to further improve the light-shielding property of the TFT 30 according to the second embodiment.

Electronic Apparatus

Next, a case will be described in which the liquid crystal device which is the above-described electro-optical device is applied to various kinds of electronic apparatuses. FIG. 12 is a plan view illustrating an exemplary configuration of a projector. Hereinafter, the projector in which the liquid crystal device is used as a light valve will be described.

As shown in FIG. 12, a lamp unit 1102 including a white light source such as halogen lamp is disposed in a projector 1100. Projection light output from the lamp unit 1102 is divided into the three primary colors of RGB by four mirrors 1106 and two dichroic mirrors 1108 disposed in a light guide 1104, and then is incident on liquid crystal panels 1110R, 1110B, and 1110G, which serve as light valves, corresponding to the primary colors, respectively.

The configurations of the liquid crystal panels 1110R, 1110B, and 1110G are the same as that of the above-described liquid crystal device. The liquid crystal panels 1110R, 1110B, and 1110G are driven by signals for the primary colors of RGB supplied from an image signal processing circuit. The light modulated by the liquid crystal panels is incident on a dichroic prism 1112 in three directions. In the dichroic prism 1112, R light and B light are refracted at 90 degrees and G light travels straight. Accordingly, images of the respective colors are combined to project a color image on a screen through a projection lens 1114.

When the display images formed by the liquid crystal panels 1110R, 1110B, and 1110G are mainly focused on, it becomes necessary for the display image formed by the liquid crystal panel 1110G to be mirror-reversed with respect to the display images formed by the liquid crystal panels 1110R and 1110B.

Since the light corresponding to the primary colors of RGB is incident on the liquid crystal panels 1110R, 1110B, and 1110G by the dichroic mirrors 1108, it is not necessary to provide a color filter.

Examples of the electronic apparatus include a mobile type personal computer, a mobile phone, a liquid crystal television, a view finder type or monitor direct vision-type video tape recorder, a car navigation apparatus, a pager, an electronic pocket book, a calculator, a word processor, a work station, a television phone, a POS terminal, and an apparatus with a touch panel, in addition to the electronic apparatus described with reference to FIG. 12. Of course, the invention is applicable to these types of electronic apparatuses.

The invention is applicable to a reflection type liquid crystal device (LCOS), a plasma display (PDP), a field emission display (FED, SED), an organic EL display, a digital micro mirror device (DMD), an electrophoretic device, and the like, in addition to the liquid crystal device described in the embodiments.

The invention is not limited to the above-described embodiments, but may be appropriately modified within the scope of the invention without departing from the gist or the spirit of the invention understandable from the claims and the entire specification of the invention. The modified electro-optical device and the electronic apparatus including the modified electro-optical device are also included in the technical scope of the invention.

The entire disclosure of Japanese Patent Application No. 2010-086765, filed Apr. 5, 2010 is expressly incorporated by reference herein.

What is claimed is:

1. An electro-optical device comprising:
   a data line;
   a scanning line;
   a pixel electrode disposed so as to correspond to an intersection of the data line and the scanning line;
   an insulating film disposed between the data line and the scanning line, the insulation film having an open hole portion holed so as to overlap with the intersection of the data line and the scanning line; and
   a transistor controlling signal supply to the pixel electrode, the transistor including:
      a semiconductor layer being continuously formed from an inside of the open hole portion up to an outside of the open hole portion, the semiconductor layer including:
         a first source/drain area electrically connected to a surface portion of the data line exposed to a bottom surface of the open hole portion;
         a channel area disposed on a side wall of the open hole portion; and
         a second source/drain area formed outside the open hole portion and electrically connected to the pixel electrode; and
      a gate electrode formed inside the open hole portion so as to overlap with at least the channel area and electrically connected to the scanning line.

2. The electro-optical device according to claim 1, wherein the scanning line is also continuously formed on the insulation film including the inside of the open hole portion and a portion formed inside the open hole portion forms the gate electrode.

3. The electro-optical device according to claim 1,
   wherein a convex portion is formed in the insulation film so as to overlap with the intersection and the open hole portion is disposed in the convex portion, and
   wherein the gate electrode is formed from the inside of the open hole portion up to the outside of the open hole portion so as to cover the convex portion.

4. The electro-optical device according to claim 1, comprising:
   a holding capacitor,
   wherein the holding capacitor includes the pixel electrode and a transparent electrode facing the pixel electrode with a capacitor insulation film interposed therebetween.

5. An electronic apparatus comprising the electro-optical device according to claim 1.

* * * * *